(12) United States Patent
Dungan

(10) Patent No.: US 12,461,324 B2
(45) Date of Patent: Nov. 4, 2025

(54) SYSTEMS AND METHODS FOR PACKAGING SEMICONDUCTOR DEVICES WITH SCALABLE INTERCONNECTS

(71) Applicant: Avago Technologies International Sales Pte. Limited, Singapore (SG)

(72) Inventor: Thomas Edward Dungan, Fort Collins, CO (US)

(73) Assignee: Avago Technologies International Sales Pte. Limited, Palo Alto, CA (US)

( * ) Notice: Subject to any disclaimer, the term of this patent is extended or adjusted under 35 U.S.C. 154(b) by 258 days.

(21) Appl. No.: 18/309,005

(22) Filed: Apr. 28, 2023

(65) Prior Publication Data

US 2024/0361547 A1 Oct. 31, 2024

(51) Int. Cl.
  *H04B 10/00* (2013.01)
  *G02B 6/42* (2006.01)
  *G02B 6/43* (2006.01)
  *H01L 25/16* (2023.01)

(52) U.S. Cl.
  CPC ........... *G02B 6/428* (2013.01); *G02B 6/4284* (2013.01); *G02B 6/43* (2013.01); *H01L 25/167* (2013.01)

(58) Field of Classification Search
  CPC ........ G02B 6/428; G02B 6/4284; G02B 6/43; G02B 6/4269; H01L 25/167; H01L 21/60; H05K 1/0274; H05K 2201/10121; H05K 1/141; H05K 1/144; H05K 1/117; H05K 2201/041; H05K 2201/049; H05K 2201/10734
  See application file for complete search history.

(56) References Cited

U.S. PATENT DOCUMENTS

| | | | | |
|---|---|---|---|---|
| 2015/0098677 | A1* | 4/2015 | Thacker | G02B 6/428 385/14 |
| 2022/0328375 | A1* | 10/2022 | Schultz | H01L 25/167 |
| 2024/0361547 | A1* | 10/2024 | Dungan | G02B 6/4269 |

OTHER PUBLICATIONS

European Patent Office, Partial Search Report, Application No. 24172463.2, Sep. 30, 2024, 17 pages.

* cited by examiner

*Primary Examiner* — Agustin Bello
(74) *Attorney, Agent, or Firm* — Quarles & Brady LLP

(57) ABSTRACT

The present invention is directed to semiconductor devices and packages. According to an exemplary embodiment, one or more substrate extensions are coupled to a base substrate, with portions of one or more substrates extending beyond the base substrate. Electrical and/or optical connections are connected to these substrate extensions. There are additional embodiments as well.

18 Claims, 7 Drawing Sheets

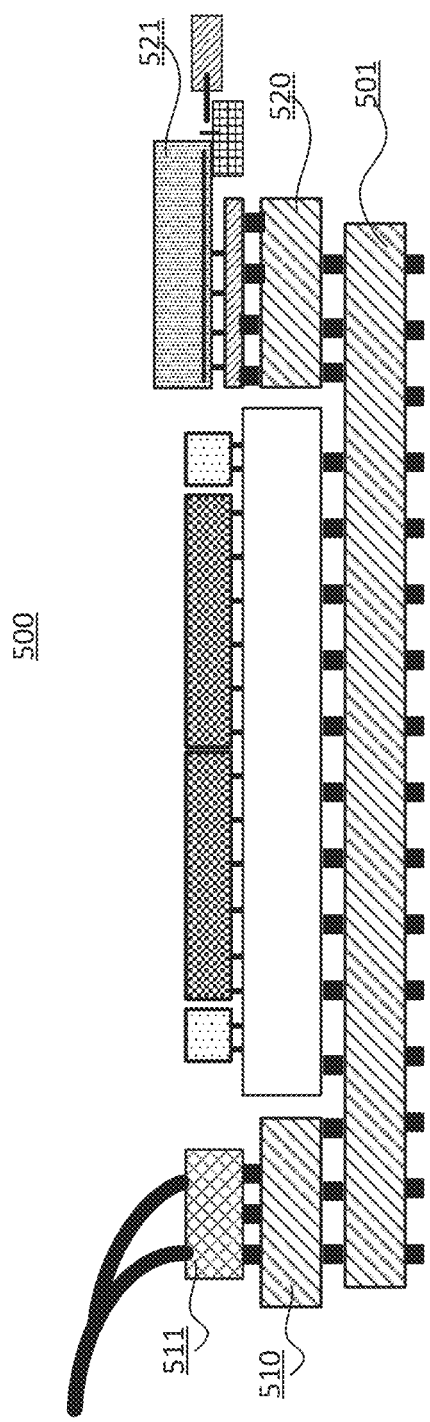

SYSTEMS AND METHODS FOR PACKAGING SEMICONDUCTOR DEVICES WITH SCALABLE INTERCONNECTS

FIELD OF INVENTION

The present invention is directed to semiconductor devices and packages.

BACKGROUND OF THE INVENTION

High-performance computation systems, specifically those designed for machine learning and artificial intelligence applications, demand efficient and robust interconnect solutions to enable seamless communication between various computational modules. These systems are often constructed with large arrays of interconnected semiconductor devices containing multiple computational modules.

Over the past, various approaches have been proposed for interconnecting semiconductor devices, but they have been inadequate for the reasons explained below. Novel and improved systems and methods for packaging semiconductor devices with scalable interconnects are desired.

BRIEF DESCRIPTION OF THE DRAWINGS

FIG. 5 is a simplified diagram illustrating a glass substrate with extension substrates according to embodiments of the present invention.

DETAILED DESCRIPTION OF THE INVENTION

Figure 1A:
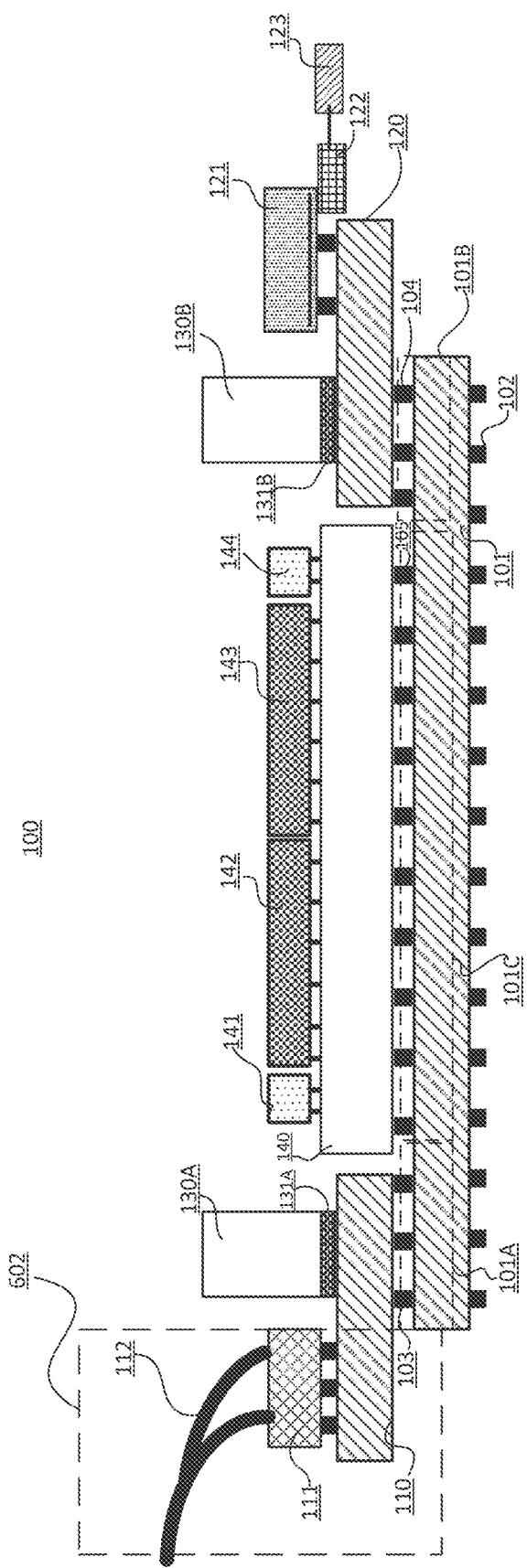
FIGS. 1A and 1B are diagrams illustrating a semiconductor device with extension substrates according to embodiments of the present invention.

The present invention is directed to semiconductor devices and packages. According to an exemplary embodiment, one or more substrate extensions are coupled to a base substrate, with portions of one or more substrates extending beyond the base substrate. Electrical and/or optical connections are connected to these substrate extensions. There are additional embodiments as well.

As mentioned above, efficient and robust interconnect solutions are desired. For example, connectivity between near-neighbor boards, such as those within the same or adjacent racks, is typically facilitated through passive copper cabling. In contrast, more distant boards are connected using schematically identical datapath connections through optical fiber.

One of the design challenges in these systems is to enable module and board designs to accommodate both electrical (e.g., copper) and optical (e.g., fiber) interconnections. Some of the existing approaches involve routing high-speed data paths from the computational die through the module substrate to the motherboard and laterally along the motherboard to a faceplate using differential electrical signaling. At the faceplate, standardized sockets allow for the use of pluggable cables to establish board-to-board connections via passive copper cables (E-to-E connection) or active optical cables (E-to-O transition). While this approach has been widely adopted, it introduces added complexity and parasitic losses associated with routing the signals through the module and motherboard. To address these issues, "copackaged optics" or "copackaged copper" solutions have emerged, where datapath cabling is directly connected to the modules. As an example, co-packaging of optical and electrical components in a semiconductor device refers to the process of integrating optical and electrical components in a single package. The package protects the semiconductor die, connects the chip to a board or other chips, and may dissipate heat. Copackaging of optical and electrical components is a promising technology for high-speed data transmission and processing in data centers. It can reduce the power consumption and latency of data transmission and improve the performance of data processing. However, existing copackaging approaches usually need unique module designs for optical and electrical connections.

Some approaches for module-to-board edge connections involve fanning out signals from the top side of the module (where the SerDes circuitry is located), transitioning down through the module to solder ball connections on the printed circuit board (PCB) along the module's lower perimeter, and then transporting signals along planar differential transmission lines to the board edge. Customization of board-to-board connections between optical and electrical signaling is generally accomplished through the use of standardized cage connectors at the board edge designed to handle either pluggable electrical (e.g., passive or active) cables or pluggable (active) optical cables. Alternative solutions include "fly-over" electrical jumpers (e.g., "single-scale," without the scale-transition feature, as provided by embodiments of the present invention, provided below) to "mid-board" connectors, followed by routing through the board and module up to the SerDes, or dedicated copackaged optics on the module with optical jumpers to the board edge.

Moreover, copackaged connections, as used in various existing approaches, take up a significant amount of area and perimeter on the module substrate, posing further challenges in system design. As the demand for higher computational performance and connection density grows, there is an ongoing need for innovative solutions that enable a common base module design to be customized for either copackaged electrical or copackaged optical use. Furthermore, there is a need to expand the connection area without increasing the base module size and to develop methods for significantly enhancing the density of copackaged electrical connections.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present. When the term "electrically coupled" is used in reference to two elements, it implies that these elements have a direct electrical connection, allowing the flow of electrical current or signals between them. Alternatively, this connection can also be established through the presence of intermediate electrically conductive components, which facilitate the transfer of electrical energy or information between the two elements. In either case, the main purpose of being "electrically coupled" is to enable electrical interaction between the connected elements.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

Figure 1B:
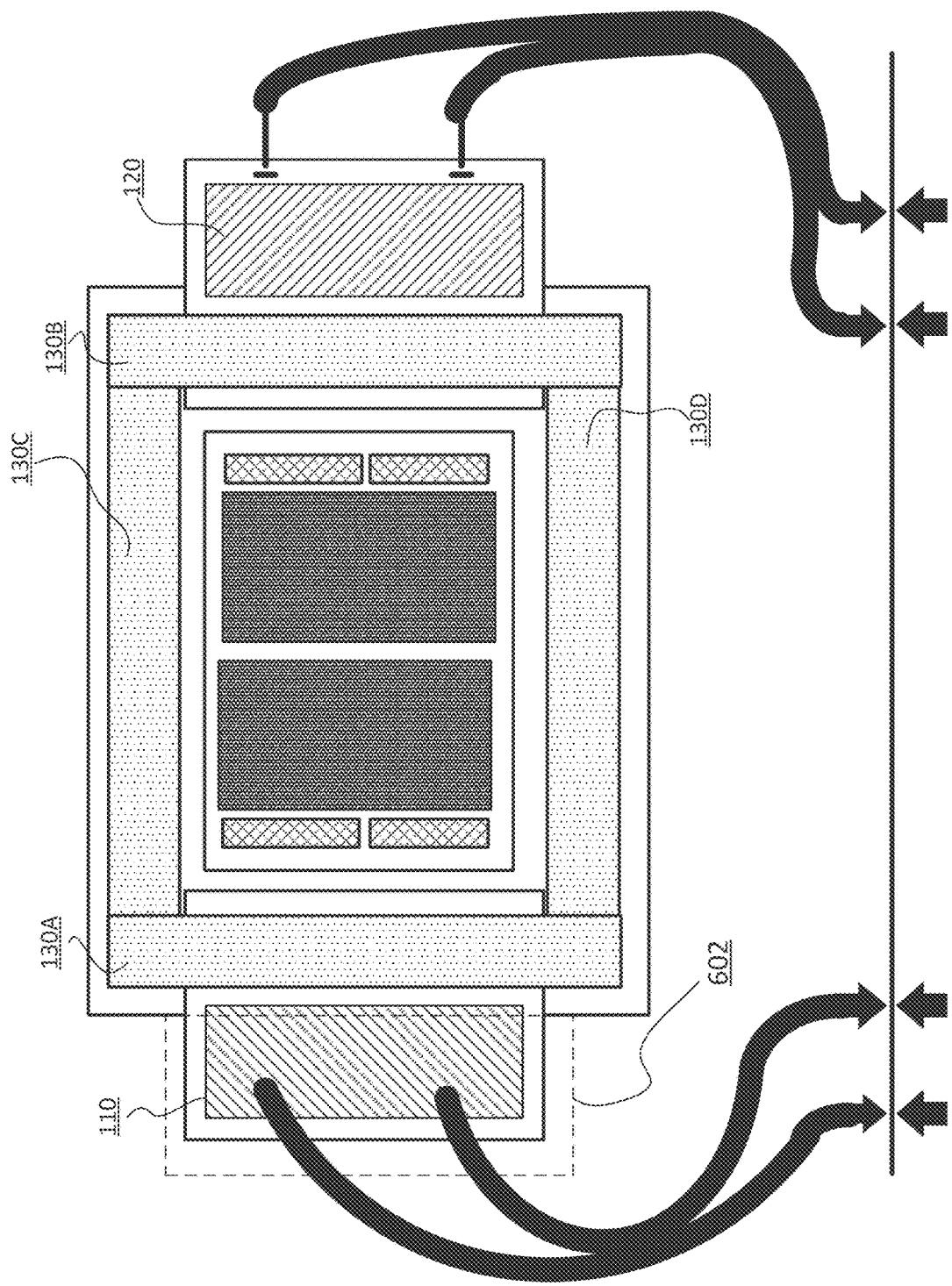

FIGS. 1A and 1B are diagrams illustrating a semiconductor device with extension substrates according to embodiments of the present invention. These diagrams merely provide an example, which should not unduly limit the scope of the claims. For instance, the terms "substrate" and "extension substrate" can refer to a circuit board, such as a printed circuit board (PCB), on which integrated circuits and other electrical components are mounted. These substrates provide a stable platform for the components, along with the necessary electrical connections for them to interact and function as a complete system.

As an example, semiconductor device 100 illustrates a packaging platform that could be customized by selection of electrical or optical soldered substrate extensions for topside compliant connection of high-speed serial data paths.

For example, in case of copackaged copper (e.g., substrate extension 110) and/or copackaged optics (e.g., substrate extension 120), the substrate extensions would move jumpers to the edge of the base substrate (e.g., base substrate 101), where passive E-E or O-O connectors (respectively) would connect at a faceplate to board-to-board cables. In various implementations, the interior module electronics (e.g., electronic devices 141, 142, 143, and 144) and base substrate would be similar to existing approaches (e.g., compared to existing approaches) for either the electrical or optical data path configurations. In various implementations, semiconductors with substrate extensions may be used to implement serializer-deserializer (SerDes) circuitries, where SerDes may be designed with sufficient drive power to drive the entire module-to-module channel between boards or to provide direct drive to the copackaged optics. For example, the base substrate may be different from existing approaches in three ways: first, it comprises sets of electrical connection points on the top surface for both electrical and optical extension substrates (e.g., connected to internal electronics via differential traces through the substrate's upper routing layers); second, it may lack electrical paths for these signals to the circuit board; and third, it may have reduced size and complexity by replacing vertical routing and signal fanout with simpler surface routing of signal traces and eliminating the need for co-packaged elements on the substrate surface.

FIG. 1B provides a top view of semiconductor device 100. For example, semiconductor device 100 may also be referred to as semiconductor package, or a packaging platform. The semiconductor device comprises a first substrate 101, commonly referred to as a base substrate. Base substrate 101 features a top surface and a bottom surface, both of which may comprise electrical contacts. For instance, the top surface includes electrical contacts 103, 104, and 105 as depicted, while the bottom surface has various electrical contacts, including electrical contact 102.

The top surface of base substrate 101 features a first region 101A on the left, a second region 101B on the right, and a third region 101C positioned between the first region 101A and the second region 101B. Each of these regions contains multiple electrical contacts. For instance, the first region 101A includes electrical contacts (e.g., electrical contact 103) for coupling to a second substrate 110, while the second region 101B contains electrical contacts (e.g., electrical contact 104) for coupling to a third substrate 120. The second substrate 110 and third substrate 120 may be referred to as substrate extensions, as respective portions of these substrates extend beyond the areas of base substrate 101. It is to be appreciated that substrate extensions expand the top surface area of the base substrate, creating additional space for the co-packaged elements. Substrate extensions allow for increased flexibility and customization in the design of semiconductor devices, accommodating both electrical and optical I/O components. In various embodiments, the base substrate can be customized for electrical and/or optical connections, with or without substrate extensions extending beyond the areas of the base substrate.

For instance, substrate extension 110 comprises components for electrical connections. Substrate extension 110 includes two regions: one region is positioned between region 101A of base substrate 101 and stiffener ring region 130A, and the other region extends beyond region 101A of base substrate 101, being coupled to electrical connector 111 (e.g., a copper connector). Electrical connector 111 is connected to electrical connections or wires. Substrate extension 110 is thermally coupled to stiffener ring region 130A via thermal interface material (TIM) 131A. "thermal interface material" can refer to a substance that facilitates heat transfer between multiple surfaces or components. As an example, electrical connector 111 may include miniature differential cable connectors, which may be used with 78 and 95-ohm conductor cables and operate from 0 to 200 MHz. For example, substrate extension 110 may include a connection site (e.g., 1.6 mm miniature differential cable connection site) to accommodate miniature differential cable connections.

As an example, stiffener ring region 130A is a portion of a stiffener ring that secures substrate extensions and provides mechanical support to base substrate 101. As depicted in FIG. 1B, which offers a top view of semiconductor device 100, the stiffener ring is configured at the outer region of base substrate 101. Within the stiffener ring, region 130A is coupled to (and secures) substrate extension 110, region 130B is coupled to (and secures) substrate extension 120, and regions 130C and 130D are coupled to (and provide support for) base substrate 101. The term "stiffener ring" refers to a component in semiconductor packages that supports electronic component packages, thereby reducing warpage. In various implementations, a stiffener ring is mounted on the top surface of the package substrate and features a reinforcement rib that is coplanar with the stiffener ring on the top surface of the package substrate. For example, a stiffener ring may be configured in various shapes, and depending on the context, a stiffener ring may also be referred to as a "stiffener member". Depending on the implementation, stiffener ring or stiffener member may be located within the extension substrate (between the extension substrate and the internal electronics), or it might not be present at all, as in the case of a lidded package.

Second region 101B of base substrate 101 is coupled to substrate extension 120. Substrate extension 120 comprises components for optical connections and includes two regions: one region is positioned between region 101B of base substrate 101 and stiffener ring region 130B, while the other region extends beyond region 101B of base substrate 101 and is coupled to an optical circuit 121. Optical circuit 121 is designed to convert electrical signals to optical and vice versa, and it is connected to optical connector 123 via interface 122. In various embodiments, optical connector 123 includes optical jumpers and/or other components. Substrate extension 120 is thermally coupled to stiffener ring region 130B via thermal interface material (TIM) 131B.

Third region 101C of base substrate 101 is coupled to circuit 140 via electrical connections (e.g., including electrical connection 105) and is positioned between regions 101A and 101B. Additional electronic components 141, 142, 143, and 144 are connected to circuit 140.

The integration of substrate extensions and scale-transition electronic connections (e.g., jumpers) allows for reduced or eliminated high-speed signal transport through the base modules and across the motherboard. Consequently, this innovation enables base substrates and motherboard designs to be re-optimized for cost reduction. Substrate extensions establish electrical signal connections to the base module through solder bumps, similar to those used to connect electronic microchips to the module in flip-chip configurations. The solder bump array for the extension board connections has an identical pattern for connecting to an extension board routing signals to an array connector for differential-pair electrical cables or for connecting to an extension board routing signals and power to an optical engine driving an optical fiber array. Depending on the implementation, materials other than solder (e.g., nanoparticulate copper paste) can be used to establish electrical connections between the extension boards and the base substrate.

In various embodiments, the substrate extensions (e.g., substrate extensions 110 and 120) comprise materials and routing layers designed for planar routing of high-frequency signals across differential signal pair conductor traces. These materials are selected to ensure a close thermal expansion match between the substrate extensions and the base-module substrate. The conductor and insulator layers thicknesses on the substrate extensions can be designed independently from those of the base substrate to optimize efficient longer-distance transport of high-speed signals on the substrate extensions compared to transport across the base substrate. Substrate extensions can overlap beyond the base module substrate's edges, optionally increasing the area available for the electrical cable array connector or the optical engine without enlarging the base module. If the extension beyond the base substrate edge is significant, a standoff element can be added for mechanical support between the motherboard and the overhanging extension board.

Figure 2:
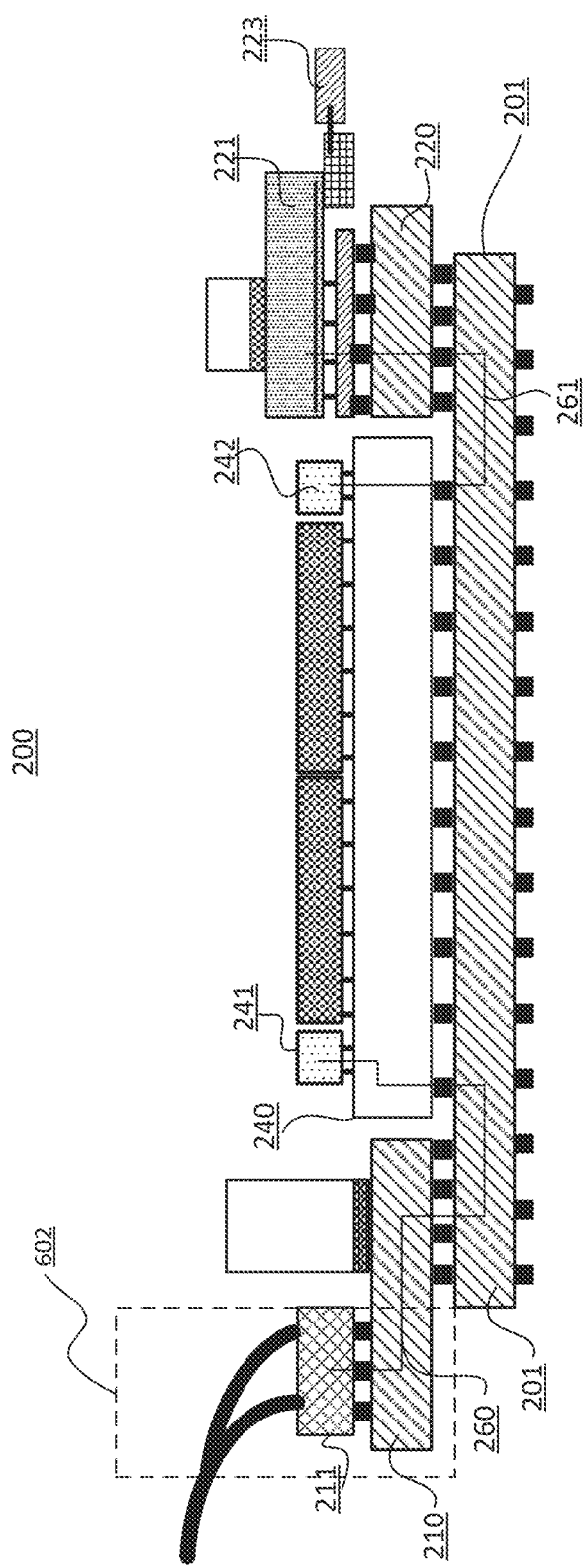
FIG. 2 is a simplified diagram illustrating electrical connections of a semiconductor device with extension substrates according to embodiments of the present invention.

FIG. 2 is a simplified diagram illustrating electrical connections of a semiconductor device with extension substrates according to embodiments of the present invention. This diagram merely provides an example, and it should not unduly limit the scope of the claims. As an example, electronic component 241 is connected to electrical connector 211 via data path 260. Data path 260 traverses through circuit 240, base substrate 201, and substrate extension 210, establishing a connection between electronic component 241 and electrical connector 211. As an example, circuit 240 may be optional and serves as an interposer, which may be implemented using silicon interposer, organic interposer, organic interposer with embedded elements, or others. FIG. 2, as an example, shows an implementation variation compared to FIG. 1: the optical circuitry is positioned beneath the stiffener ring, enabling the stiffener ring to provide thermal management for optical circuits. Likewise, electronic component 242 is connected to optical circuit 221 through data path 261. Data path 261 passes through circuit 240, base substrate 201, and substrate extension 220, providing a connection between electronic component 242 and optical circuit 221. Optical circuit 221 converts electrical signals to optical signals for transmission at optical connector 223 and also converts received optical signals at optical connector 223 to electrical signals.

It should be noted that data paths to optical and electrical connectors meet various operating parameters. For example, data paths in embodiments of the present invention comprise top-side paths for high-speed signals, while other signals may remain within the base substrate. By limiting high-speed signals to the top side, the base substrate can be simplified, potentially reducing layers or area. Data path signaling on the top side of the base substrate connects interior electronics (e.g., interposer) with soldered substrate extensions. The layer composition of substrate extension boards can be optimized based on different operating parameters, such as electrical boards featuring double-height top and bottom SerDes routing without power routing, and optical boards with greater insertion loss tolerance in signal routing and additional supply routing. In various embodiments, power delivery concerns for the optical engine on optical extension boards are addressed, potentially without vertical connections from the optical engine to the motherboard, by reducing optical engine power through direct-drive and off-module lasers. To accommodate cooling requirements, heat sinks or other components may be incorporated for the optical engine on the extension board outside the stiffener. In various implementations, there are some differences between electrical and optical connectors. While electrical connectors are passive and do not require power delivery, optical elements may need power supplied vertically through the base substrate and the extension board. For example, an optical extension substrate routes power that an electrical extension substrate does not. A common interface may include power connections for the optical extension substrate, which would be unused with an electrical extension substrate. For example, whether power delivery to the optical elements is vertical or has lateral routing in the optical extension substrate may depend on the positioning of the optical elements relative to the base substrate. As an example, if they are on the overhanging extension outside (e.g., region 602 in FIGS. 1A-2) the base substrate area, as shown in the right of FIG. 1A, lateral power routing may be needed. In FIG. 2, the optical elements are positioned under the stiffener ring, allowing for vertical power routing. It is to be noted that substrate extensions may be utilized in a module without stiffener rings or in a module where the stiffener ring is positioned on the base substrate's underside rather than on top.

Figure 3A:
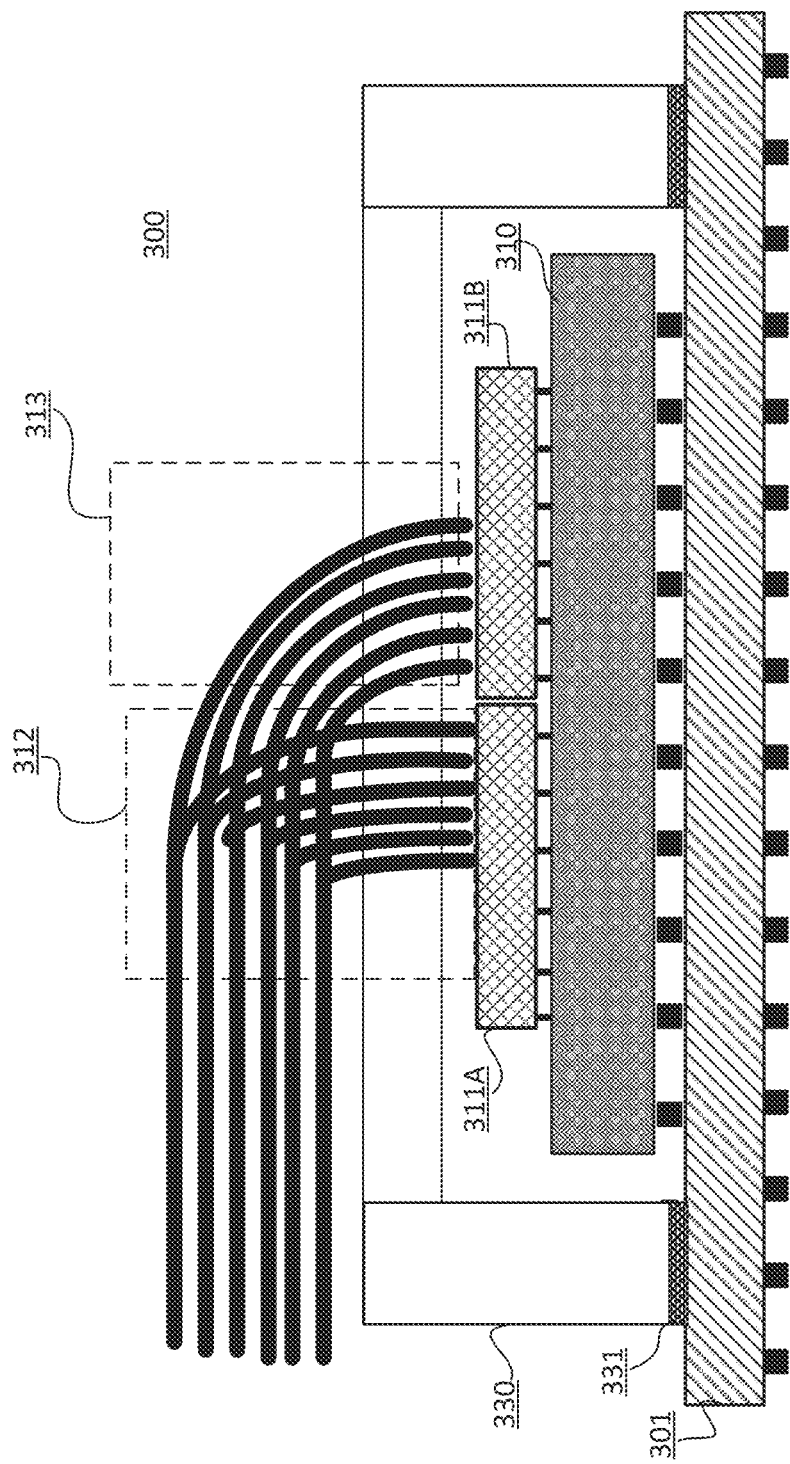
FIGS. 3A and 3B are diagrams illustrating wire bending of a semiconductor device with extension substrates according to embodiments of the present invention.
Figure 3B:
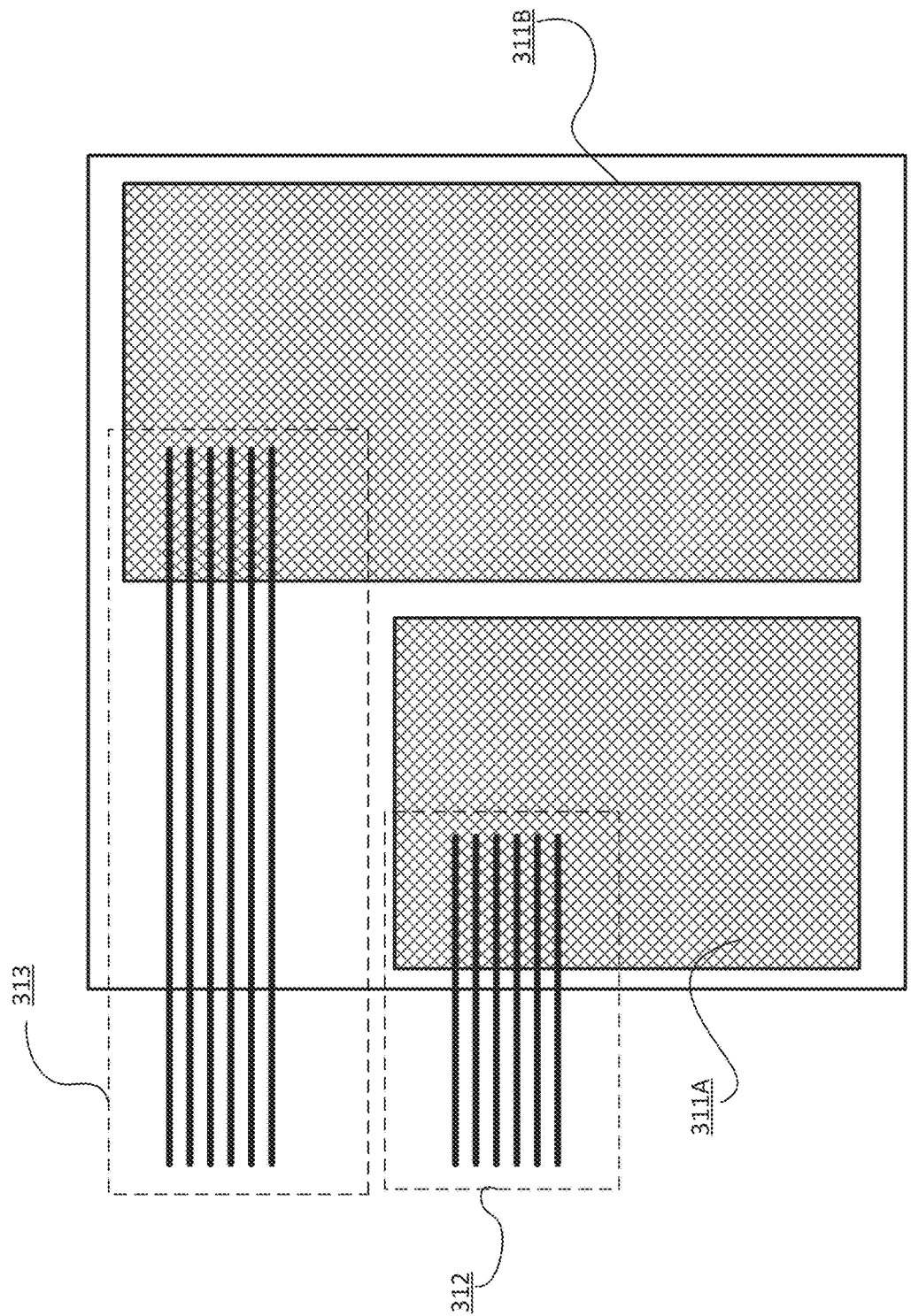

FIGS. 3A and 3B are diagrams illustrating wire bending of a semiconductor device with extension substrates according to embodiments of the present invention. These diagrams merely provide an example, and should not unduly limit the scope of the claims. As mentioned earlier, an electrical connector (e.g., TwinAx) on a substrate extension may require specific configurations. The height needed for the curvature of the miniature differential cable stack might be prohibitive for some implementations. However, it is important to note that the substrate extension can reduce the miniature differential cable curvature height by dividing the cables into two bundles, thereby decreasing cable stress and improving reliability. FIG. 3A presents a side view of two bundles of electrical connections, where bundle 312 is coupled to connection region 311A, and bundle 313 is coupled to connection region 311B. Both connections 311A and 311B are attached to substrate extension 310. FIG. 3B offers a top view of two bundles of electrical connections coupled to two different connection regions, thus avoiding excessive bending caused by a single thick bundle. Additionally, FIG. 3A shows that bundles 312 and 313 curve around stiffener ring 330, which is connected to base substrate 301 via TIM 331.

Figure 4:
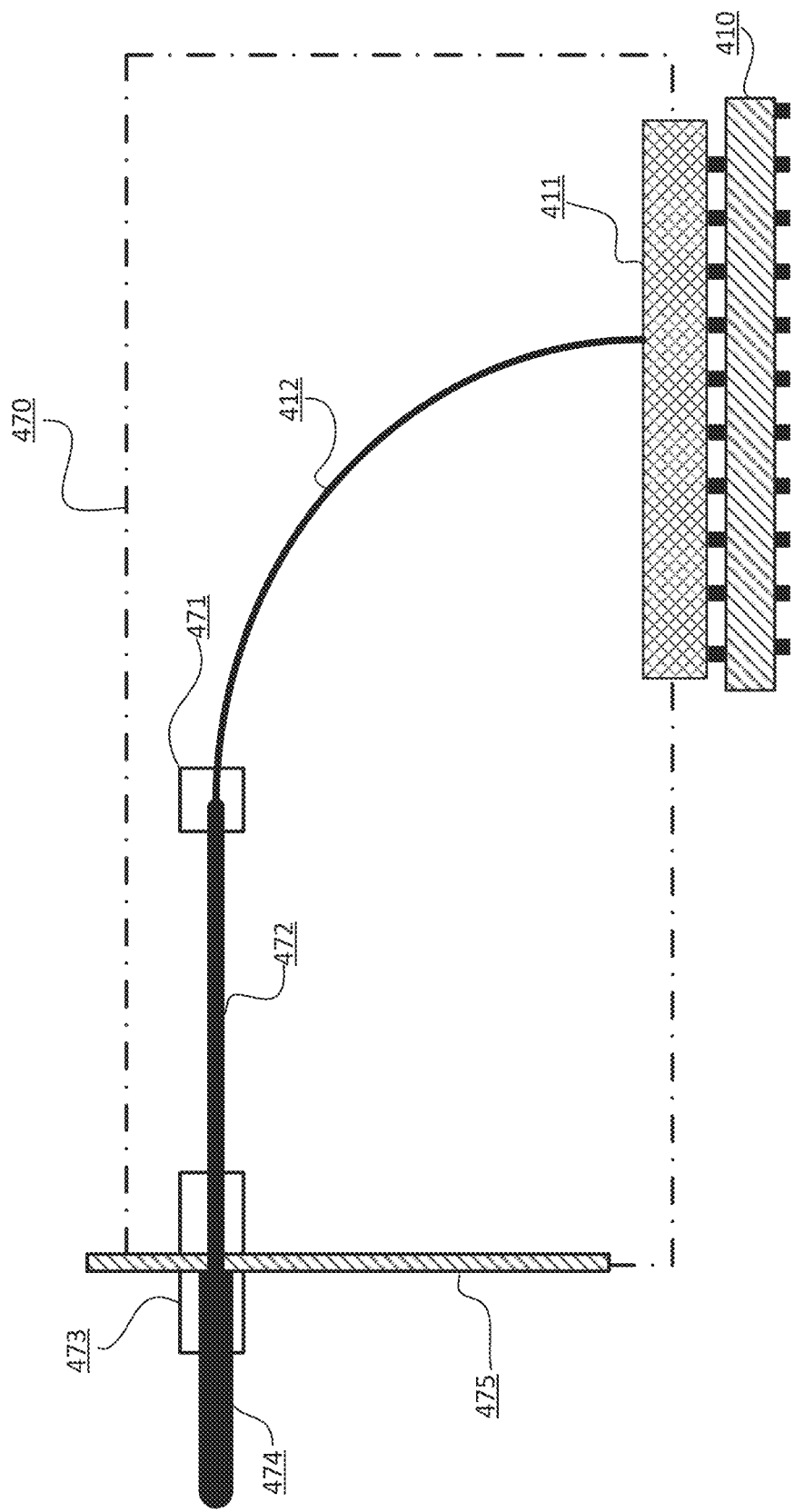
FIG. 4 is a simplified diagram illustrating electrical connections for an extension substrate according to embodiments of the present invention.

FIG. 4 is a simplified diagram illustrating electrical connections for an extension substrate according to embodiments of the present invention. This diagram merely provides an example, which should not unduly limit the scope of the claims. In various embodiments, miniature differential cable jumper connections may be used. For example, miniature differential cable jumpers may have a narrower gauge compared to board-to-board cables (e.g., 36 gauge in jumpers and 34 or higher in board-to-board cables), with a gauge conversion in the E-E connector at the faceplate. To maximize efficiency, an additional miniature differential cable scale conversion may be used from an existing jumper scale, like 36 gauge wire on approximately 600 um conductor separation, to a spacing closer to that of the 224 Gbps (56 GHz Nyquist PAM4) differential pair for multi-mm routes, for instance, around 200 um conductor separation with suitably scaled wire.

As illustrated in FIG. 4, electrical connector 411, which may include miniature differential cable connections, is connected to substrate extension 410. Microcable 412 is coupled to electrical connector 411, potentially through a dense pluggable connector. Microcable 412 transitions to minicable 472 (e.g., a larger cable scale at 36 gauge, approximately 600 um) after only a short distance (the length necessary to fan out to the larger cable). For instance, the scale conversion from microcable 412 to minicable 472 (e.g., for the bulk of the jumper to faceplate) may be provided "in-line," meaning the smaller scale would transition to the larger scale independently for each cable, possibly with a permanent connection, rather than requiring a ganged connector. Minicable 472 transitions, at faceplate 475, into board-to-board cable 474 using a pluggable E-E scale transition (e.g., an electrical-to-electrical pluggable connection where the conductor thickness changes in gauge). In various embodiments, wired connection section 470 comprises a custom-designed set of ganged cables with embedded transitions from mini to micro and a pre-defined three-dimensional shape to fit the required physical layout of the transition from the micro cable connector to the faceplate E-E connector.

In various implementations, differential-pair cables used for module-to-module connections within a board may use only microscaled cables, or they might use scale-transition cables. Electrical substrate extensions may be used with single-scale differential pair cables (at the expense of a lower areal connection density), or transition-scale cables might be used with array connectors without extension boards, whether the connectors were direct-to-module (copackaged I/O) or connections to a board.

For example, to reduce or eliminate high-speed signal routing through the base module to the motherboard in systems with multiple modules on a board, a copackaged I/O solution for module-to-module routing within the board may be needed. This short-range routing would likely be electrical rather than optical, and could be accomplished by directly connecting copackaged electrical cables from one device's substrate extension array connector to that of another device. A variation might be to use a single double-ended electrical extension board as a flying bridge between devices.

FIG. 5 is a simplified diagram illustrating a glass substrate with extension substrates according to embodiments of the present invention. This diagram merely provides an example, which should not unduly limit the scope of claims. In the case of using substrate extensions with glass base substrate, glass substrate extension may be used to ensure accurate matching of thermal expansion coefficients. The use of extension boards would still provide the benefit of reducing the length of high-speed signal routing on the glass-substrate base module, enabling easier design optimization. On a glass substrate, a stiffener ring may not be necessary, implying that substrate extensions may not need to significantly protrude beyond the base substrate. For instance, substrate extension 510, mounted on base substrate 501, extends only marginally beyond the base substrate, providing an adequate contact area for mounting electrical connector 511 without a stiffener ring occupying space. Similarly, substrate extension 520, mounted on base substrate 501, extends just slightly beyond the base substrate, offering sufficient contact area for mounting optical circuit connector 521 without the need for a stiffener ring. In various implementations, it is still beneficial for customizing the semiconductor package for either electrical or optical I/O after assembling the base substrate. For example, substrate extension could be glass-based if necessary for matching the coefficients of thermal expansion (CTE). Additionally, by placing the majority of the differential signal routing length on the substrate extension, the complexity of supporting low-loss routing on the base glass substrate may be reduced.

Embodiments of the present invention offer various advantages. They enable customization of the base substrate for electrical or optical co-packaged input/output (I/O) based on the chosen substrate extensions. This differs from conventional methods that necessitate the design of the module base substrate and potentially the SerDes circuitry specifically for the type of co-packaged I/O (electrical or optical).

Co-packaged optical solutions in existing approaches are often costly and power-intensive for within-board connections, effectively limiting such solutions to a single module per board if cross-board connections are to be avoided. In contrast, embodiments of the present invention are more cost and power-efficient.

Moreover, these embodiments deliver high area (through substrate extensions) and connection density (through scale-transition cables) to achieve the aggregate bandwidth necessary for module-to-board edge or module-to-module within-board communication. Existing co-packaged approaches-whether optical or electrical-typically utilize one-dimensional arrays of cable or fiber connections along the module perimeter, which are insufficiently dense to meet bandwidth requirements.

Embodiments of the present invention may be useful in distributed high-performance computing or artificial intelligence systems composed of many replicated interconnected processing modules across several equipment racks. These systems require module-to-module connections of varying lengths, with short links preferring electrical signaling for cost and power reduction, while longer links necessitate optical signaling. However, a system with high-bandwidth signaling requirements might benefit from embodiments of the present invention, even if customization of a common base module for electrical versus optical I/O is not required.

A general aspect of the present invention includes a semiconductor device that includes a first substrate that may include a first top surface a first bottom surface. The first top surface may include a first region and a second region and a third region, the third region being positioned between the first region and the second region. The first region may include a first plurality of electrical contacts. The second region may include a second plurality of electrical contacts. The third region may include a third plurality of electrical contacts. The device also includes a circuit that includes a fourth plurality of electrical contacts, the fourth plurality of electrical contacts being electrically coupled to the third plurality of electrical contacts. The device also includes a second substrate may include a fourth region and a fifth region, the fourth region may include a fifth plurality of electrical contacts electrically coupled to the first plurality of electrical contacts, the fourth region being positioned over the first region, the fifth region being positioned outside the first substrate. The device also includes a third substrate may include a sixth region and a seventh region, the sixth region may include a sixth plurality of electrical contacts electrically coupled to the second plurality of electrical contacts, the sixth region being positioned over the first region, the fifth region being positioned outside the first substrate. The device also includes an electrical connector electrically coupled to the second substrate. The device also includes an optical connector electrically coupled to the third substrate.

Implementations may include one or more of the following features. The circuit may be directly coupled to the first substrate using the third plurality of electrical contacts and the fourth plurality of electrical contacts. The circuit is positioned over the third region. The optical connector may include an optical circuit. The electrical connector may include a copper connector. The semiconductor device may include a plurality of electronic devices coupled to the circuit. The semiconductor device may include a stiffener ring, which includes an eighth region and a ninth region, the eighth region being coupled to the fourth region, the ninth region being coupled to the third region. The stiffener ring further may include a tenth region that is coupled to the sixth region. The circuit is electrically coupled to the second substrate via the first substrate. The semiconductor device may include a photonic integrated circuit coupled to the seventh region. For instance, the term "photonic integrated circuit" could refer to an integrated circuit that incorporates elements capable of interacting with light in various ways, such as processing or manipulating optical signals. The first bottom surface may include a seventh plurality of electrical contacts. The semiconductor device may include a cable jumper coupled to the second substrate. For example, "cable jumper" may refer to a short conductor used to establish connections between different electronic components or points. The semiconductor device may include a fiber jumper coupled to the third substrate. The semiconductor device may include a thermal interface material coupled to the second substrate. For example, "fiber jumper" may refer to a short fiber segment employed to create optical connections between various optical components.

Another general aspect of the present invention provides a semiconductor device that includes a first substrate, which may include a first top surface a first bottom surface. The first top surface may include a first region and a second region and a third region, the third region being positioned between the first region and the second region, the first region may include a first plurality of electrical contacts. The second region may include a second plurality of electrical contacts. The third region may include a third plurality of electrical contacts. The device also includes a circuit that includes a fourth plurality of electrical contacts, the fourth plurality of electrical contacts being electrically coupled to the third plurality of electrical contacts. The device also includes a second substrate may include a fourth region and a fifth region. The fourth region may include a fifth plurality of electrical contacts electrically coupled to the first plurality of electrical contacts, the fourth region being positioned over the first region, the fifth region being positioned outside the first substrate. The device also includes a third substrate that includes a sixth region and a seventh region. The sixth region may include a sixth plurality of electrical contacts electrically coupled to the second plurality of electrical contacts, the sixth region being positioned over the first region, the fifth being region positioned outside the first substrate. The device also includes a stiffener ring that includes an eighth region and a ninth region, the eighth region being thermally coupled to the fourth region, the ninth region being coupled to the third region.

Another general aspect of the present invention provides a semiconductor device that includes a first substrate may include a first top surface a first bottom surface, the first top surface may include a first region and a second region and a third region, the third region being positioned between the first region and the second region. The first region may include a first plurality of electrical contacts, the second region may include a second plurality of electrical contacts. The third region may include a third plurality of electrical contacts. The device also includes a circuit that includes a fourth plurality of electrical contacts, the fourth plurality of electrical contacts being electrically coupled to the third plurality of electrical contacts. The device also includes a second substrate may include a second top region and second bottom region. The second substrate may include a fourth region and a fifth region, the fourth region being positioned on the second top region, the fifth region being positioned on the second bottom region. The fourth region may include a fifth plurality of electrical contacts electrically coupled to the first plurality of electrical contacts, the fourth region being positioned over the first region, the fifth region being positioned outside the first substrate. The device also includes a third substrate may include a sixth region and a seventh region, the sixth region may include a sixth plurality of electrical contacts electrically coupled to the second plurality of electrical contacts, the sixth region being positioned the first region, the fifth region positioned outside the first substrate, the seventh region may include a seventh plurality of electrical contacts. The device also includes an optical circuit may include an electrical interface and an optical interface, the electrical interface being coupled to the seventh plurality of electrical contacts.

While the above is a full description of the specific embodiments, various modifications, alternative constructions and equivalents may be used. Therefore, the above description and illustrations should not be taken as limiting the scope of the present invention which is defined by the appended claims.

What is claimed is:
1. A semiconductor device comprising:
   a first substrate comprising a first top surface and a first bottom surface, the first top surface comprising a first region, a second region and a third region, the third region being positioned between the first region and the second region, the first region comprising a first plurality of electrical contacts, the second region comprising a second plurality of electrical contacts, the third region comprising a third plurality of electrical contacts;
   an integrated circuit comprising a fourth plurality of electrical contacts, the fourth plurality of electrical contacts being electrically coupled to the third plurality of electrical contacts;
   a second substrate comprising a fourth region and a fifth region, the fourth region comprising a fifth plurality of electrical contacts electrically coupled to the first plurality of electrical contacts, the fourth region being positioned over the first region, the fifth region being positioned outside the first substrate;
   a third substrate comprising a sixth region and a seventh region, the sixth region comprising a sixth plurality of electrical contacts electrically coupled to the second plurality of electrical contacts, the sixth region being positioned over the second region, the seventh region being positioned outside the first substrate;
   a stiffener ring coupled to the fourth region and the sixth region, the stiffener ring comprising an opening exposing a portion of the third region;
   an electrical connector electrically coupled to the second substrate; and
   an optical connector coupled to the third substrate.

2. The semiconductor device of claim 1, wherein the integrated circuit is directly mounted to the first substrate using the third plurality of electrical contacts and the fourth plurality of electrical contacts.

3. The semiconductor device of claim 1, wherein the integrated circuit is positioned over the third region.

4. The semiconductor device of claim 1, wherein the optical connector is coupled to an optical circuit.

5. The semiconductor device of claim 1, wherein the electrical connector comprises a copper connector.

6. The semiconductor device of claim 1, further comprising a plurality of electronic devices coupled to the integrated circuit.

7. The semiconductor device of claim 1, wherein the integrated circuit is electrically coupled to the second substrate via the first substrate.

8. The semiconductor device of claim 1, further comprising a photonic integrated circuit coupled to the seventh region.

9. The semiconductor device of claim 1, wherein the first bottom surface comprises a seventh plurality of electrical contacts.

10. The semiconductor device of claim 1, further comprising a cable jumper coupled to the second substrate.

11. The semiconductor device of claim 1, further comprising a fiber jumper coupled to the third substrate.

12. The semiconductor device of claim 1, further comprising a thermal interface material coupled to the second substrate.

13. A semiconductor device comprising:
a first substrate comprising a first top surface and a first bottom surface, the first top surface comprising a first region, a second region and a third region, the third region being positioned between the first region and the second region, the first region comprising a first plurality of electrical contacts, the second region comprising a second plurality of electrical contacts, the third region comprising a third plurality of electrical contacts;
an integrated circuit comprises a fourth plurality of electrical contacts, the fourth plurality of electrical contacts being electrically coupled to the third plurality of electrical contacts;
a second substrate comprising a fourth region and a fifth region, the fourth region comprising a fifth plurality of electrical contacts electrically coupled to the first plurality of electrical contacts, the fourth region being positioned over the first region, the fifth region being positioned outside the first substrate;
a third substrate comprising a sixth region and a seventh region, the sixth region comprising a sixth plurality of electrical contacts electrically coupled to the second plurality of electrical contacts, the sixth region being positioned over the second region, the seventh region being positioned outside the first substrate; and
a stiffener ring comprising a ring comprising an eighth region and a ninth region, the eighth region being thermally coupled to the fourth region, the ninth region being coupled to the sixth region, the stiffener ring comprising an opening exposing a portion of the third region.

14. The semiconductor device of claim 13 wherein:
the fifth region comprises a seventh plurality of electrical contacts coupled to an electrical connector; and
the seventh region comprises an eighth plurality of electrical contacts coupled to an optical circuit.

15. The semiconductor device of claim 14 further comprising:
a cable jumper coupled to the electrical connector; and
the optical circuit comprises an electrical interface coupled to the eighth plurality of electrical contact and an optical interface.

16. A semiconductor device comprising:
a first substrate comprising a first top surface a first bottom surface, the first top surface comprising a first region and a second region and a third region, the third region being positioned between the first region and the second region, the first region comprising a first plurality of electrical contacts, the second region comprising a second plurality of electrical contacts, the third region comprising a third plurality of electrical contacts;
an integrated circuit comprises a fourth plurality of electrical contacts, the fourth plurality of electrical contacts being electrically coupled to the third plurality of electrical contacts;
a second substrate comprising a second top region and second bottom region, the second substrate further comprising a fourth region and a fifth region, the fourth region being positioned on the second top region, the fifth region being positioned on the second bottom region, the fourth region comprising a fifth plurality of electrical contacts electrically coupled to the first plurality of electrical contacts, the fourth region being positioned over the first region;
a third substrate comprising a sixth region and a seventh region, the sixth region comprising a sixth plurality of electrical contacts electrically coupled to the second plurality of electrical contacts, the sixth region being positioned over the second region the seventh region comprises a seventh plurality of electrical contacts;
a stiffener ring coupled to the fourth region and the sixth region, the stiffener ring comprising an opening exposing a portion of the third region; and
an optical circuit comprising an electrical interface and an optical interface, the electrical interface being coupled to the seventh plurality of electrical contacts.

17. The semiconductor device of claim 16, wherein the optical circuit is configured to convert electrical signals to optical signals.

18. The semiconductor device of claim 16, wherein the integrated circuit is electrically coupled to the optical circuit via the first substrate and the third substrate.

* * * * *